United States Patent [19]

Kurashima

[11] Patent Number: 4,916,520

[45] Date of Patent: Apr. 10, 1990

[54] SEMICONDUCTOR DEVICE WITH AIRBRIDGE INTERCONNECTION

[75] Inventor: Yasumi Kurashima, Tokyo, Japan

[73] Assignee: NEC Corporation, Japan

[21] Appl. No.: 243,974

[22] Filed: Sep. 13, 1988

[30] Foreign Application Priority Data

Sep. 24, 1987 [JP] Japan ................................. 62-240017

[51] Int. Cl.[4] ........................ H01L 23/48; H01L 29/52
[52] U.S. Cl. ......................................... 357/71; 357/65; 357/68
[58] Field of Search ............................. 357/71, 68, 65

[56] References Cited

U.S. PATENT DOCUMENTS

| | | | |
|---|---|---|---|
| 4,308,090 | 12/1981 | Te Velde et al. ...................... | 357/71 |
| 4,646,126 | 2/1987 | Iizuka ..................................... | 357/68 |
| 4,807,002 | 2/1989 | Donzelli ................................. | 357/68 |

Primary Examiner—Andrew J. James
Assistant Examiner—Jerome Jackson, Jr.
Attorney, Agent, or Firm—Laff, Whitesel, Conte & Saret

[57] ABSTRACT

There is disclosed a semiconductor device comprising a plurality of lower level interconnections having first, second and third lower level interconnections, an upper level interconnection connected to the first and second lower level interconnections and extending over the third lower level interconnection in spacing relationship, and at least one pier formed on a central portion of the upper surface of one of the first and second lower level interconnections, and the pier has a width less than that of aforesaid one of the first and second lower level interconnections and is covered in its entire surface with a film formed of the same material as of the upper level interconnection, so that a force applied for wafer separation is partially supported by the pier.

6 Claims, 4 Drawing Sheets

PRIOR-ART

PRIOR-ART

PRIOR-ART

PRIOR-ART

SEMICONDUCTOR DEVICE WITH AIRBRIDGE INTERCONNECTION

FIELD OF THE INVENTION

This invention relates to a semiconductor device and, more particularly, to an airbridge-type interconnection incorporated therein.

BACKGROUND OF THE INVENTION

In general, a signal propagation time period is largely dominated by the resistance of the propagation path and the capacitance applied to the propagation path. Therefore, research and development efforts have been made for reduction in resistance or capacitance so as to implement a semiconductor integrated circuit operable at an ultra high speed. One of the solutions to reduce the capacitance applied to the signal propagation path is to employ airbridge-type metallizations as described in "A HIGH-YIELD GaAs MSI DIGITAL IC PROCESS", IEDM 82, pages 162 to 165.

A typical process sequence of fabricating the airbridge-type metallization is illustrated in FIGS. 1A to 1D. When there are formed active areas for component transistors (not shown) and a first level interconnections (not shown) in a semiconductor substrate 1, a first interlevel insulating film 2 overlies the surface of the semiconductor substrate 1. On the first interlevel insulating layer 2 is deposited a conductive material which is etched and patterned to form second level interconnections 3, 4 and 5. For electrical isolation from the second level interconnections 3 and 5, a second inter-level insulating film 6 is deposited on the second level interconnections 3, 4 and 5, and, then, contact windows 7 and 8 are formed in the second inter-level insulating film 6 to partially expose the top surfaces of the second level interconnections 3 and 5, respectively. The resultant structure of this stage is shown in FIG. 1A.

Subsequently, a temporal pier 9 of polymide is formed on the second inter-level insulating film 6 as shown in FIG. 1B, and a conductive material of gold is deposited by using a plating technique to form a conductive strip serving as a third level interconnection 10 which is conformal to the upper surface of the structure. The third level interconnection 10 is connected at one end thereof to the second level interconnection 3 and at the other end thereof to the second level interconnection 5 as shown in FIG. 1C, then the second level interconnection 3 is electrically coupled to the second level interconnection 5 through the third level interconnection 10.

Finally, the temporal pier 9 is removed by using an isotropic etching technique, so that the third level interconnection 10 is spaced apart from the second inter-level insulating film 6, and a hollow space 11 is formed between the third level interconnection 10 and the second inter-level insulating film 6. This results in that the third level interconnection 10 becomes an airbridge-type interconnection.

The central portion of the third level interconnection 10 is not physically contact with the second inter-level isolating film 6, so that the parasitic capacitance is drastically decreased. However, a problem is encountered in the prior-art semiconductor device with the airbridge-type interconnections in that some of the airbridge-type interconnections tend to be crushed during wafer separation process. Namely, after a resilient sheet is bonded to the wafer, the wafer is gently rubbed with a rubber roller to deepen the scribing lines, then stretching the resilient sheet for separation of the semiconductor chips. When the wafer is of the gallium arsenide, the wafer has a thickness of about 350 microns after grinding the back surface of the wafer because of the brittleness. Then, the rubbing step is carried out for perfect separation. As a result, the airbridge-type interconnection is subjected to a pressing force due to the rubbing. This results in deterioration in reliability due to disconnection and in increasing in the parasitic capacitance due to physical contact with the second inter-level insulating film 6. The reason why some of the airbridge interconnections are crushed is that a force concentrates on the central portion of each airbridge-type interconnection 10 because the central portion is higher than the other portions by some microns.

SUMMARY OF THE INVENTION

It is therefore an important object of the present invention to provide a semiconductor device with airbridge-type interconnections which are hardly crushed during the wafer separation process.

To accomplish these objects, the present invention proposes to provide a pier for supporting a force applied thereto during the wafer separation process.

In accordance with the present invention, there is provided a semiconductor device fabricated on a semiconductor substrate overlain by a first insulating film, comprising: (a) a plurality of lower level interconnections formed on the first insulating film, the lower level interconnections having first, second and third lower level interconnections, the first and second lower level interconnections being located on both sides of the third lower level interconnection; (b) an upper level interconnection connected to the first and second lower level interconnections and extending over the third lower level interconnection in spacing relationship; and (c) at least one pier formed on a central portion of the upper surface of one of the first and second lower level interconnections, the pier having a width less than that of aforesaid one of the first and second lower level interconnections and being covered in its entire surface with a film formed of the same material as of the upper level interconnection. The lower level interconnection on which the pier is provided may be the first lower level interconnection, and the upper level interconnection may continuously extend with a constant width over the pier so that the entire surface of the pier is covered with the upper level interconnection. Or else, the lower level interconnection on which the pier is provided may be a dummy pad selected from bonding pads and not serving in electrical operations. Favorably, the third lower level interconnection is a signal line, and the first and second lower level interconnections and the upper level interconnection may constitute a power supplying line such as, for example, a Vcc line, a $V_{EE}$ line or a ground line which is larger in width than the signal line in most of implementations. Owing to the larger width, the pier of the present invention may be securely formed between the first lower level interconnection and the upper level interconnection which has substantially the same width as the first and second lower level interconnections and extends therewith. The lower level interconnection may be composed of a titanium film on the insulating film, a platinum film on the titanium film and a gold film on the titanium film, and the upper level interconnection may be made of gold by plating techniques. The pier is made of resin such as, for example, polymide.

BRIEF DESCRIPTION OF THE DRAWINGS

The features and advantages of a semiconductor device and the process of fabricating thereof according to the present invention will be more clearly understood from the following description taken in conjunction with the accompanying drawings in which:

FIGS. 2A, 2C, 2E, 2G and 2I are plan views showing a process sequence used for forming a semiconductor device according to the present invention;

DESCRIPTION OF THE PREFERRED EMBODIMENTS

First Embodiment

Figure 1A:
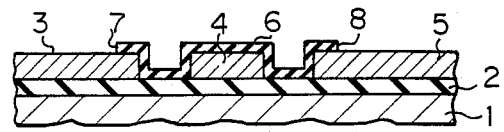
FIGS. 1A to 1D are cross sectional views showing a typical process sequence for forming an airbridge interconnection.
Figure 1B:
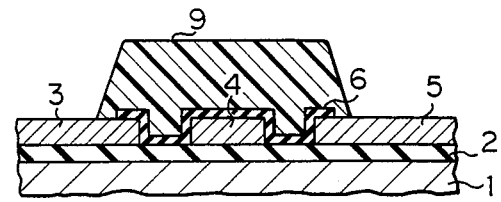
Figure 1C:
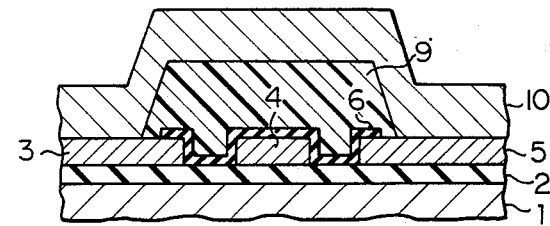
Figure 1D:
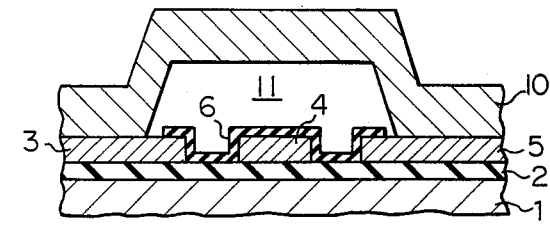
Figure 2A:
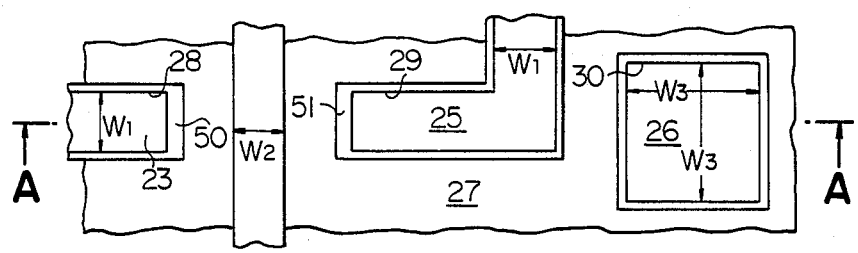
Figure 2B:
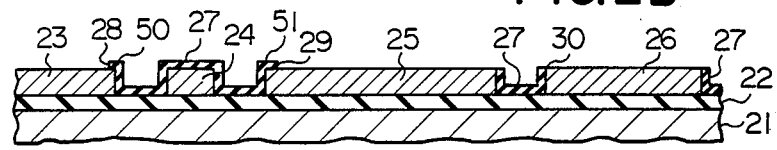
FIGS. 2B, 2D, 2F and 2H are cross sectional views taken along lines A—A, C—C, E—E and G—G of FIGS. 2A, 2C, 2E and 2G, respectively.

A process sequence of fabricating a semiconductor device according to the present invention starts with preparation of a semiconductor substrate or a semiconductor wafer 21. In the semiconductor substrate 21 are formed a plurality of active areas (not shown) each forming part of a component transistor. Although not shown in the drawings, a plurality of first level interconnections are also formed in the semiconductor substrate 21. The semiconductor substrate 21 is overlain by a first interlevel insulating film 22. On the first interlevel insulating layer 22 are deposited conductive materials of a titanium (Ti) film, a platinum film and a gold film in sequence which are etched and patterned to form second level interconnections 23, 24, 25 and 26 each having a thickness of about 0.5 micron. In this instance, the second level interconnection 26 serves as a bonding pad which is kept idle in electrical operations of the semiconductor device. In other words, no interconnection is connected to the dummy pad 26. For electrical isolation, a second inter-level insulating film 27 is deposited on the second level interconnections 23, 24, 25 and 26, and, then, parts 28, 29 and 30 of the second inter-level insulating film 27 are etched away to expose the entire portions of the top surfaces except for end portions 50 and 51 of the second level interconnections 23, 25 and 26, respectively. The interconnection 24 serves as a signal line and has the width W2 of about 2 microns, and the interconnections 23 and 25 serve as a power supplying line and has the width W1 of about 50 microns. The idle pad 26 has a square plan shape of about 150 microns (W3) × about 150 microns (W3). The resultant structure of this stage is shown in FIGS. 2A and 2B.

Figure 2C:
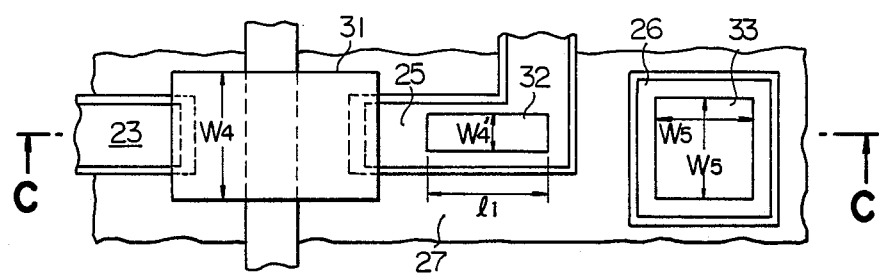
Figure 2D:
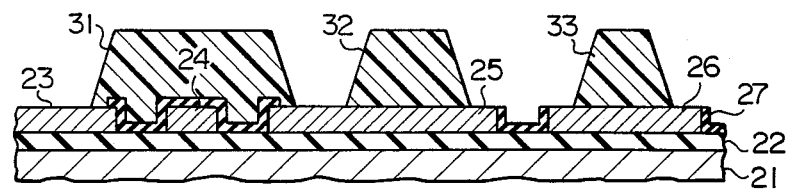

Subsequently, piers 31, 32 and 33 of polymide are formed on the second inter-level insulating film 27 covering the second level interconnection 24 and respective upper surfaces of the second level interconnections 25 and 26 as shown in FIGS. 2C and 2D. The pier 31 has a width W4 greater than the width W1 (which is about 50 microns) of the interconnections 23 and 25, and the pier 32 has the width W4' of about 40 microns less than the width W1 of the interconnection 25 and the length 11 of about 80 microns. The pier 33 has a square shape of about 140 microns (W5) × about 140 microns (W5). All of the piers 31, 32 and 33 are approximately equal in height to one another. The height from the interconnections 23, 25 and 26 is about 2.0 microns.

Figure 2E:
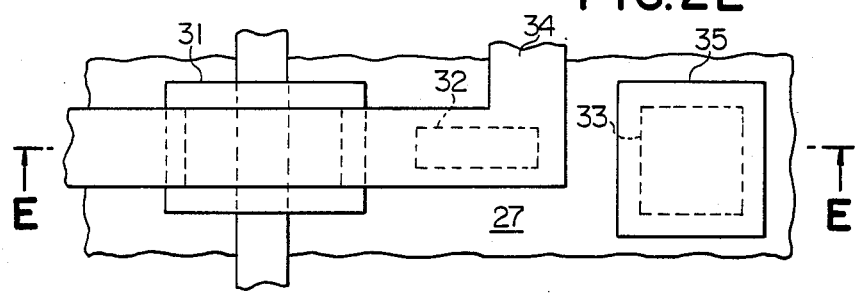
Figure 2F:
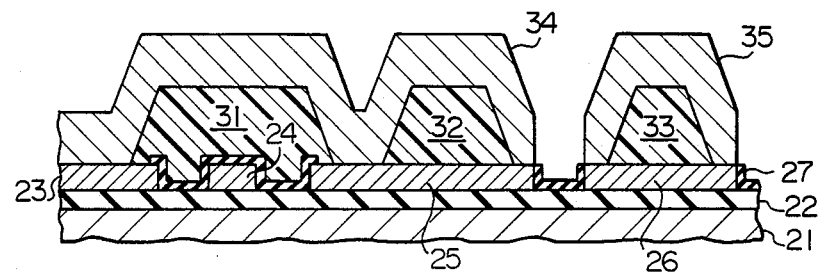

A conductive material of gold (not shown) is deposited by sputtering to a thickness of about 500 angstroms over the entire surface of the structure and a photo resist film pattern (not shown) is formed such that just interconnections 23, 25 and 26 and a portion of about 50 microns width between the interconnections 23 and 25 are exposed. Therefore, the polymide piers 32 and 33 are entirely exposed and the polymide pier 31 is partially exposed in the width wise direction. Thereafter, a gold plating is conducted by using the photo resist film pattern as the mask and using the thin gold film of about 500 angstroms thickness as the current path. Then, removing the photo resist film pattern, a plasma etching is entirely carried out to remove the thin gold film of about 500 angstroms. At this time, the surface of the gold layer interconnection of about 2.5 microns thickness by the plating is somewhat removed. By the gold plating techniques, there are formed a conductive strip of about 2.5 microns thickness serving as a third level interconnection 34 and an isolated conductive strip 35 which are conformal to the upper surface of the structure. The third level interconnection 34 is formed on the second level interconnection 23 and on the second level interconnection 25 as shown in FIGS. 2E and 2F, then the second level interconnection 23 is electrically coupled to the second level interconnection 25 through the third level interconnection 34. The third level interconnection 34 has a width of about 50 microns, so that side surfaces of the pier 31 is exposed but the entire surface of the pier 32 is covered with the third level interconnection 34. The isolated conductive strip is arranged to perfectly cover the entire surface of the pier 33. The third level interconnection 34 and the isolated conductive strip 35 are simultaneously formed from the conductive material, so that a portion of the third level interconnection 34 covering the pier 31 is approximately equal in height to a portion of the third level interconnection 34 covering the pier 32 and to the isolated conductive strip 35.

Figure 2G:
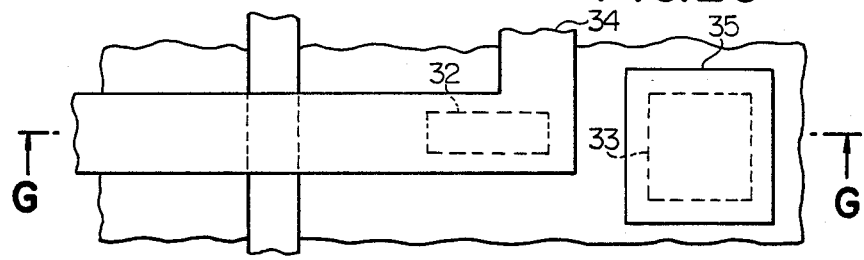
Figure 2H:
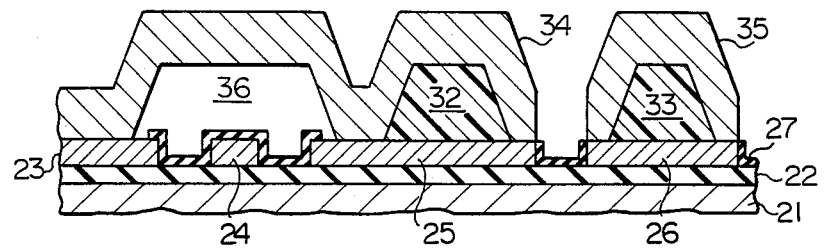
Figure 21:
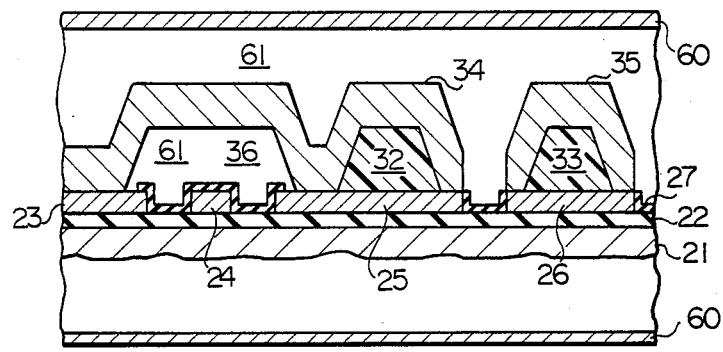

The pier 31 is removed by using an isotropic etching technique, so that the third level interconnection 34 is spaced apart from the second inter-level insulating film 27, and a hollow space 36 is formed between the third level interconnection 34 and the second inter-level insulating film 27 as will be seen from FIGS. 2G and 2H. This results in that the third level interconnection 10 becomes an airbridge-type interconnection. The central portion of the third level interconnection 34 is not physically contact with the second inter-level isolating film 27, so that the parasitic capacitance is drastically decreased. However, piers 32 and 33 are left on the second level interconnections 25 and 26 because both of the piers 32 and 33 are perfectly covered with the conductive material.

When the fabrication process is completed, the wafer including the semiconductor substrate 21 is separated into a plurality of chips. In this wafer separation process, a force produced by the rubber roller is applied to the wafer for breaking into the chips. However, a part of the force is applied onto not only the central portion of the third level interconnection 34 over the second level interconnection 24 but also the portions on the piers 32 and 33. Then, the airbridge-type interconnection 34 is hardly crushed by the application of the part of the force. This results in improvement in reliability and in preventing the semiconductor device from undesirable large parasitic capacitance.

After separating in individual chips, each of the semiconductor chips is installed in a ceramic package or a glass sealed package 60 in which an inert gas such as nitrogen ($N_2$) 61 or the air is filled as shown in FIG. 2I.

Additionally, the layers 34 and 35 are approximately equal in width to the interconnections 23 to 26 and overlapped with each other.

Second Embodiment

Figure 3A:
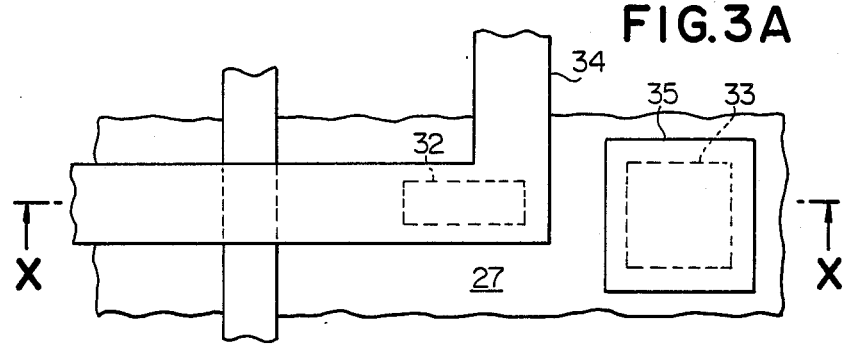
FIG. 3A is a plan view showing the structure of another semiconductor device according to the present invention.
Figure 3B:
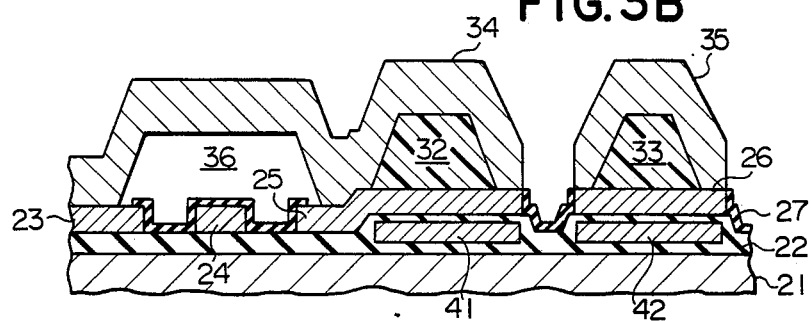
FIG. 3B is a cross sectional view taken along line X—X of FIG. 3A.

Turning to FIGS. 3A and 3B of the drawings, there is shown the structure of another semiconductor device embodying the present invention. The structure illustrated in FIGS. 3A and 3B is similar to that illustrated in FIGS. 2G and 2H except for pillow strips 41 and 42 buried in the first inter-level insulating film 22 under the second level interconnections 25 and 26. Then, films, interconnections and so on are denoted by reference numerals designating the corresponding component films and interconnections of the semiconductor device illustrated in FIGS. 2G and 2H for the sake of simplicity. Since the pillow strips 41 and 42 with thicknesses ranging between about 0.5 micron and about 1.0 micron are buried in the first inter-level insulating film 22, the portion of the third level interconnection 34 over the second level interconnection 24 is lower than the portion of the third level interconnection 34 on the pier 32 and the isolated conductive strip 35. This results in that the part of force is supported by the piers 32 and 33 only. Then, the air bridge-type third level interconnection 34 can not be crushed.

The pillow strips 41 and 42 are electrically isolated from any interconnection and located under the interconnections 34 and 35 only.

Although particular embodiments of the present invention have been shown and described, it will be obvious to those skilled in the art that various changes and modifications may be made without departing from the spirit and scope of the present invention.

What is claimed is:

1. A semiconductor device fabricated on a semiconductor substrate overlain by a first insulating film, comprising:
   (a) a plurality of lower level interconnections formed on said first insulating film, said lower level interconnections having first, second and third lower level interconnections, said first and second lower level interconnections being located on both sides of said third lower level interconnection;
   (b) an upper level interconnection connected to said first and second lower level interconnections and extending over said third lower level interconnection, said upper level interconnection being spaced from said third lower level interconnection; and
   (c) at least one pier formed on a central portion of an upper surface of one of said first and second lower level interconnections, said pier having a width less than that of the aforesaid one of the first and second lower level interconnections and being covered over its entire exposed surface with a film formed of the same material as of said upper level interconnection.

2. A semiconductor device as set forth in claim 1, in which a portion of said upper level interconnection over said third lower level interconnection is approximately equal in height to a portion of said film covering an upper surface of said pier.

3. A semiconductor device as set forth in claim 2, in which at least one of said lower level interconnections serves as a bonding pad which is kept idle in electrical operations.

4. A semiconductor device as set forth in claim 3, in which another pier is further formed on said bonding pad and has a width less than that of the aforesaid one of said first and second lower level interconnections so that the entire surface of said another pier is covered with a conductive strip, the portion of said upper level interconnection over said third lower level interconnection being approximately equal in height to a portion of said conductive strip covering an upper surface of said another pier.

5. A semiconductor device as set forth in claim 4, in which each pier is formed of polymide.

6. A semiconductor device fabricated on a semiconductor substrate overlain by a first insulating film, comprising:
   (a) a plurality of lower level interconnections formed on said first insulating film, said lower level interconnections having first, second and third lower level interconnections, said first and second lower level interconnections being located on both sides of said third lower level interconnection;
   (b) an upper level interconnection connected to said first and second lower level interconnections and extending over said third lower level interconnection, said upper level interconnection being spaced from said third lower level interconnection; and
   (c) at least one pier formed on a central portion of an upper surface of one of said first and second lower level interconnections, said pier having a width less than that of the aforesaid one of the first and second lower level interconnections and being covered over its entire exposed surface with a film formed of the same material as of said upper level interconnection, a portion of said upper level interconnection over said third lower level interconnection being approximately equal in height to a portion of said film covering an upper surface of said pier, at least one of said lower level interconnections serving as a bonding pad which is kept idle in electrical operations, another pier being further formed on said bonding pad and having a width less than that of the aforesaid one of said first and second lower level interconnections so that the entire surface of said another pier is covered with a conductive strip, the portion of said upper level interconnection over said third lower level interconnection being approximately equal in height to a portion of said conductive strip covering an upper surface of said another pier, said semiconductor device being further provided with first and second pillow strips buried under aforesaid one of said first and second lower level interconnections and said bonding pad, respectively, the portion of said upper level interconnection over said third lower level interconnection being lower than the portion of said film covering the upper surface of said pier and the portion of said conductive strip.

* * * * *